(12) United States Patent
Foreman et al.

(10) Patent No.: US 8,458,632 B2
(45) Date of Patent: Jun. 4, 2013

(54) EFFICIENT SLACK PROJECTION FOR TRUNCATED DISTRIBUTIONS

(75) Inventors: Eric A. Foreman, Fairfax, VT (US); James C. Gregerson, Hyde Park, NY (US); Peter A. Habitz, Hinesburg, VT (US); Jeffrey G. Hemmett, St. George, VT (US); Debjit Sinha, Wappingers Falls, NY (US); Natesan Venkateswaran, Hopewell Junction, NY (US); Chandramouli Visweswariah, Croton-On-Hudson, NY (US); Xiaoyue Wang, Kanata (CA); Vladimer Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/197,320

(22) Filed: Aug. 3, 2011

(65) Prior Publication Data

US 2013/0036395 A1    Feb. 7, 2013

(51) Int. Cl.
*G06F 9/455* (2006.01)
*G06F 17/50* (2006.01)

(52) U.S. Cl.
USPC ............................................................ 716/113

(58) Field of Classification Search
USPC .................. 716/108, 113, 132, 134
See application file for complete search history.

(56) References Cited

U.S. PATENT DOCUMENTS

| | | | |
|---|---|---|---|
| 6,711,717 B2 | 3/2004 | Nystrom et al. | |
| 7,243,320 B2 | 7/2007 | Chiu et al. | |
| 7,376,924 B2 | 5/2008 | Curtin et al. | |
| 7,469,394 B1 | 12/2008 | Hutton et al. | |
| 7,539,893 B1 | 5/2009 | Ferguson | |
| 7,689,954 B2 | 3/2010 | Zhang et al. | |
| 7,861,199 B2 | 12/2010 | Visweswariah et al. | |
| 7,992,114 B1 * | 8/2011 | Adams et al. | 716/110 |
| 2007/0277134 A1 * | 11/2007 | Zhang et al. | 716/6 |
| 2008/0313590 A1 | 12/2008 | Foreman et al. | |
| 2009/0106722 A1 | 4/2009 | Gregory et al. | |
| 2010/0287517 A1 * | 11/2010 | Buss et al. | 716/6 |
| 2010/0306723 A1 * | 12/2010 | Abbaspour et al. | 716/6 |
| 2011/0289465 A1 * | 11/2011 | Adams et al. | 716/113 |

OTHER PUBLICATIONS

Bai et al., "Uncertainty-Aware Circuit Optimization," 2000, pp. 58-63, Design Automation Conference.
Chen et al., "Predicting Potential Performance for Digital Circuits," Mar. 2002, pp. 253-262, IEEE Transactions on Computer-Aided Design of Integrated circuits and Systems, vol. 21, No. 3.

* cited by examiner

*Primary Examiner* — Vuthe Siek
*Assistant Examiner* — Brian Ngo
(74) *Attorney, Agent, or Firm* — Hoffman Warnick LLC; Richard M. Kotulak (57) ABSTRACT

Aspects of the present invention provide solutions for projecting slack in an integrated circuit. A statistical static timing analysis (SSTA) is computed to get a set of Gaussian distributions over a plurality of variation sources in the integrated circuit. Based on the Gaussian distributions, a truncated subset and a remainder subset of the Gaussian distributions are identified. Then data factors that represent a ratio between the remainder subset and the truncated subset are obtained. These data factors are applied to the SSTA to root sum square (RSS) project the slack for the integrated circuit that takes into account the absence of the truncated subset.

20 Claims, 8 Drawing Sheets

EFFICIENT SLACK PROJECTION FOR TRUNCATED DISTRIBUTIONS

BACKGROUND OF THE INVENTION

The subject matter disclosed herein relates to design of integrated circuits. Specifically, the subject matter disclosed herein relates to more efficiently projecting slack during design of integrated circuits.

As structural dimensions of integrated circuits have become ever-smaller, meeting design conditions across a plurality of these devices has become more difficult. In analyzing functions of these devices, designers often look to the timing quantities (e.g., slacks) of paths through a circuit to determine which paths are most likely to affect device performance. Particularly, designers attempt to find the paths through the circuit which have the highest probability of affecting performance, i.e., being "critical." Due to process variations across a plurality of devices, each timing quantity (i.e., slack) is a statistical distribution. That is, each timing quantity for a given path has a probability distribution indicating the path's likelihood of having such a timing performance across a plurality of devices. Several techniques exist for timing propagation of statistical distributions, but the most computationally efficient typically rely on propagation of Gaussian distributions.

Oftentimes these distributions do not accurately reflect the entirety of timing quality range for a particular design. Rather, a more accurate indication of the timing quantities would be achieved by truncating a part of the distribution curve. However, this truncating significantly reduces computational performance, as it renders the resultant distributions non-Gaussian in nature.

BRIEF DESCRIPTION OF THE INVENTION

Aspects of the present invention provide solutions for projecting slack in an integrated circuit. A statistical static timing analysis (SSTA) is computed to get a set of Gaussian distributions over a plurality of variation sources in the integrated circuit. Based on the Gaussian distributions, a truncated subset and a remainder subset of the Gaussian distributions are identified. Then data factors that represent a ratio between the remainder subset and the truncated subset are obtained. These data factors are applied to the SSTA to root sum square (RSS) project the slack for the integrated circuit that takes into account the absence of the truncated subset.

A first aspect of the invention provides a method of projecting slack in an integrated circuit, the method comprising: computing a statistical static timing analysis (SSTA) over a plurality of variation sources to get a plurality of Gaussian distributions having a Gaussian distribution for each variation source; identifying, from the plurality of Gaussian distributions, a truncated subset and a remainder subset; obtaining data factors representing a ratio between the remainder subset and the truncated subset; and applying the data factors to the SSTA to root sum square (RSS) project the slack for the integrated circuit takes into account an absence of the truncated subset.

A second aspect of the invention provides a computer system comprising: a set of computing devices configured to projecting slack in an integrated circuit, by performing actions comprising: computing a statistical static timing analysis (SSTA) to get a Gaussian representation over a plurality of variation sources; identifying a truncated subset and a remainder subset of the Gaussian representation; obtaining data factors representing a ratio between the remainder subset and the truncated subset; and applying the data factors to the SSTA to root sum square (RSS) project the slack for the integrated circuit that takes into account an absence of the truncated subset.

A third aspect of the invention provides a program product stored on a computer readable storage medium for projecting slack in an integrated circuit, which when executed on at least one computing device, performs the following: computes a statistical static timing analysis (SSTA) to obtain Gaussian distributions over a plurality of variation sources; identifies a truncated subset and a remainder subset of the Gaussian distributions; obtains data factors representing a ratio between the remainder subset and the truncated subset; and applies the data factors to the SSTA to root sum square (RSS) project the slack for the integrated circuit that takes into account an absence of the truncated subset.

Still yet, any of the components of the present invention could be deployed, managed, serviced, etc., by a service provider who offers to control electricity to a device.

Embodiments of the present invention also provide related systems, methods and/or program products.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Aspects of the present invention provide solutions for projecting slack in an integrated circuit. A statistical static timing analysis (SSTA) is computed to get a plurality of Gaussian distributions (alternatively "a plurality of orthogonal axes on a Gaussian Joint Probability Distribution Function"), one for each variation source modeled. In the event at least one of the variation sources is to be modeled as truncated, then the distributions may be divided into a truncated set and a non-truncated set. When reporting timing results, the distributions are projected (sampled) at a desired sigma value. During this projection, the truncated set may be efficiently represented by modeling all sources of variation as being truncated, and subsequently scaling the non-truncated set by a factor that accounts for their non-truncated nature.

As a result, the current invention allows efficient propagation of multiple Gaussian sources of variation, while allowing a fraction/thereof to be represented as truncated during projection. Use of the Gaussian distribution during propagation leads to faster computation of slacks in the integrated circuit than would otherwise be possible using the non-Gaussian distribution that would otherwise result from the truncation. This accelerated computation makes it feasible for chip designers to create a process window that covers the desired fraction/portion for some subset of distributions, which would otherwise be prohibitively expensive. Slacks measured in this way are more accurate than the more "pessimistic" slacks that would be gained from the use of full distributions under circumstances where truncation is appropriate.

Figure 1:
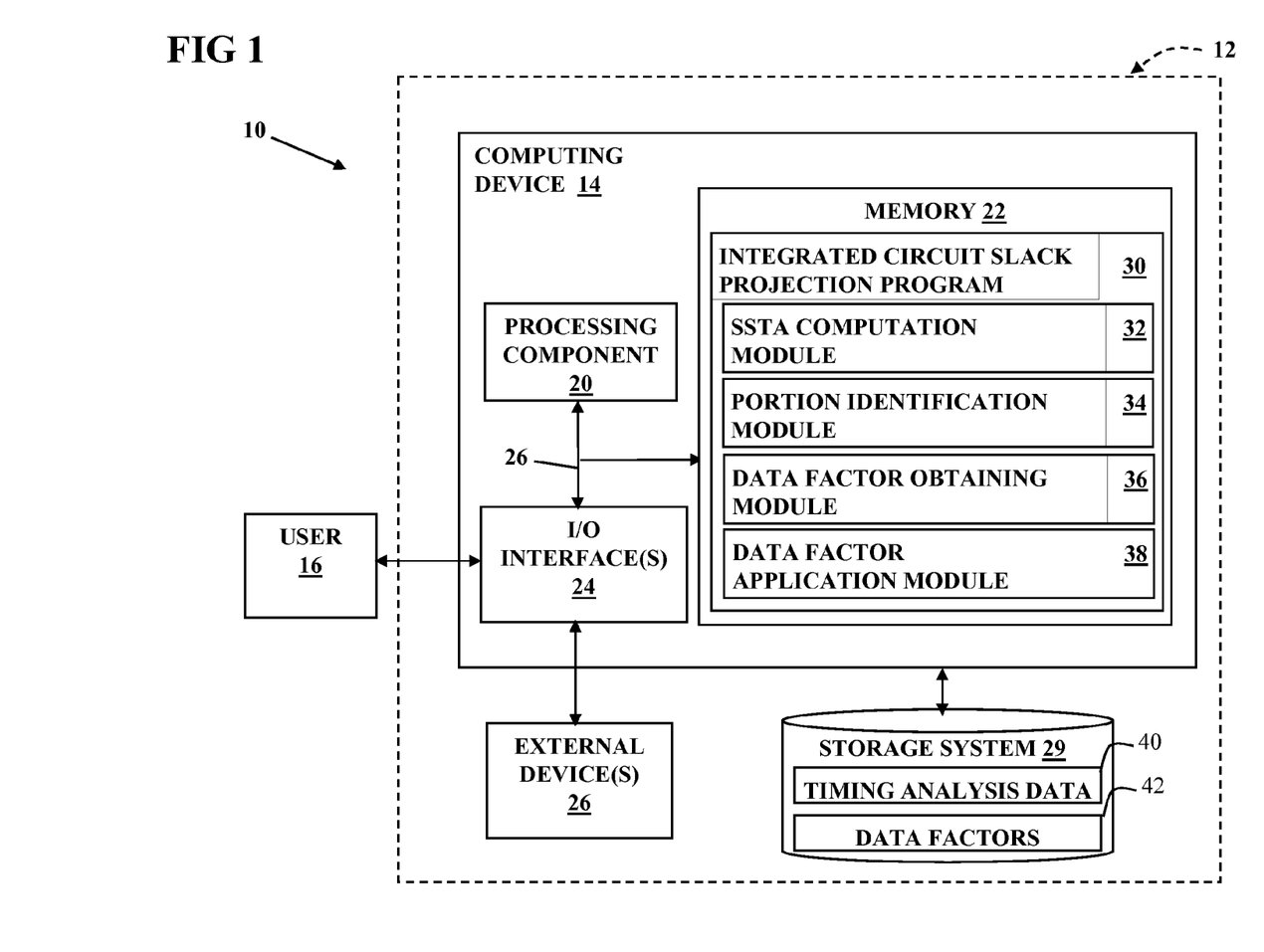
FIG. 1 shows a data processing system suitable for implementing an embodiment of the present invention.

Turning to the drawings, FIG. 1 shows an illustrative environment 10 for projecting slack in an integrated circuit according to an embodiment. To this extent, environment 10 includes a computer system 12 that can perform a process described herein in order to project slack in an integrated circuit. In particular, computer system 12 is shown including a computing device 14 that includes an integrated circuit slack projection program 30, which makes computing device 14 operable to project slack in an integrated circuit by performing a process described herein.

Computing device 14 is shown including a processing component 20 (e.g., one or more processors), a memory 22, a storage system 29 (e.g., a storage hierarchy), an input/output (I/O) interface component 24 (e.g., one or more I/O interfaces and/or devices), and a communications pathway 26. In general, processing component 20 executes program code, such as integrated circuit slack projection program 30, which is at least partially fixed in memory 22. While executing program code, processing component 20 can process data, which can result in reading and/or writing transformed data from/to memory 22 and/or I/O interface component 24 for further processing. Pathway 26 provides a communications link between each of the components in computer system 12. I/O interface component 24 can comprise one or more peripheral I/O devices, which enable communications with an external device 26. Additionally, or in the alternative, I/O interface component 24 can comprise one or more human I/O devices, which enable a human user 16 to interact with computer system 12 and/or one or more communications devices to enable a system user 16 to communicate with computer system 12 using any type of communications link. To this extent, integrated circuit slack projection program 30 can manage a set of interfaces (e.g., graphical user interface(s), application program interface, and/or the like) that enable human and/or system users 16 to interact with integrated circuit slack projection program 30. Further, integrated circuit slack projection program 30 can manage (e.g., store, retrieve, create, manipulate, organize, present, etc.) the data, such as mobile device data 40 and/or transaction details 42, using any solution.

In any event, computer system 12 can comprise one or more general purpose computing articles of manufacture 14 (e.g., computing devices) capable of executing program code, such as integrated circuit slack projection program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, integrated circuit slack projection program 30 can be embodied as any combination of system software and/or application software. In any event, the technical effect of computer system 12 is to provide processing instructions to computing device 14 in order to project slack in an integrated circuit.

Further, integrated circuit slack projection program 30 can be implemented using a set of modules 32-38. In this case, a module 32-38 can enable computer system 12 to perform a set of tasks used by integrated circuit slack projection program 30, and can be separately developed and/or implemented apart from other portions of integrated circuit slack projection program 30. As used herein, the term "component" means any configuration of hardware, with or without software, which implements the functionality described in conjunction therewith using any solution, while the term "module" means program code that enables a computer system 12 to implement the actions described in conjunction therewith using any solution. When fixed in a memory 22 of a computer system 12 that includes a processing component 20, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 12.

When computer system 12 comprises multiple computing devices 14, each computing device can have only a portion of integrated circuit slack projection program 30 fixed thereon (e.g., one or more modules 32-38). However, it is understood that computer system 12 and integrated circuit slack projection program 30 are only representative of various possible equivalent computer systems that may perform a process described herein. To this extent, in other embodiments, the functionality provided by computer system 12 and integrated circuit slack projection program 30 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 12 includes multiple computing devices 14, the computing devices can communicate over any type of communications link. Further, while performing a process described herein, computer system 12 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

As discussed herein, integrated circuit slack projection program 30 enables computer system 20 to project slack in an integrated circuit. To this extent, integrated circuit slack projection program 30 is shown including an SSTA computation module 32, a subset identification module 34, a data factor obtaining module 36, and a data factor application module 38.

Figure 2:
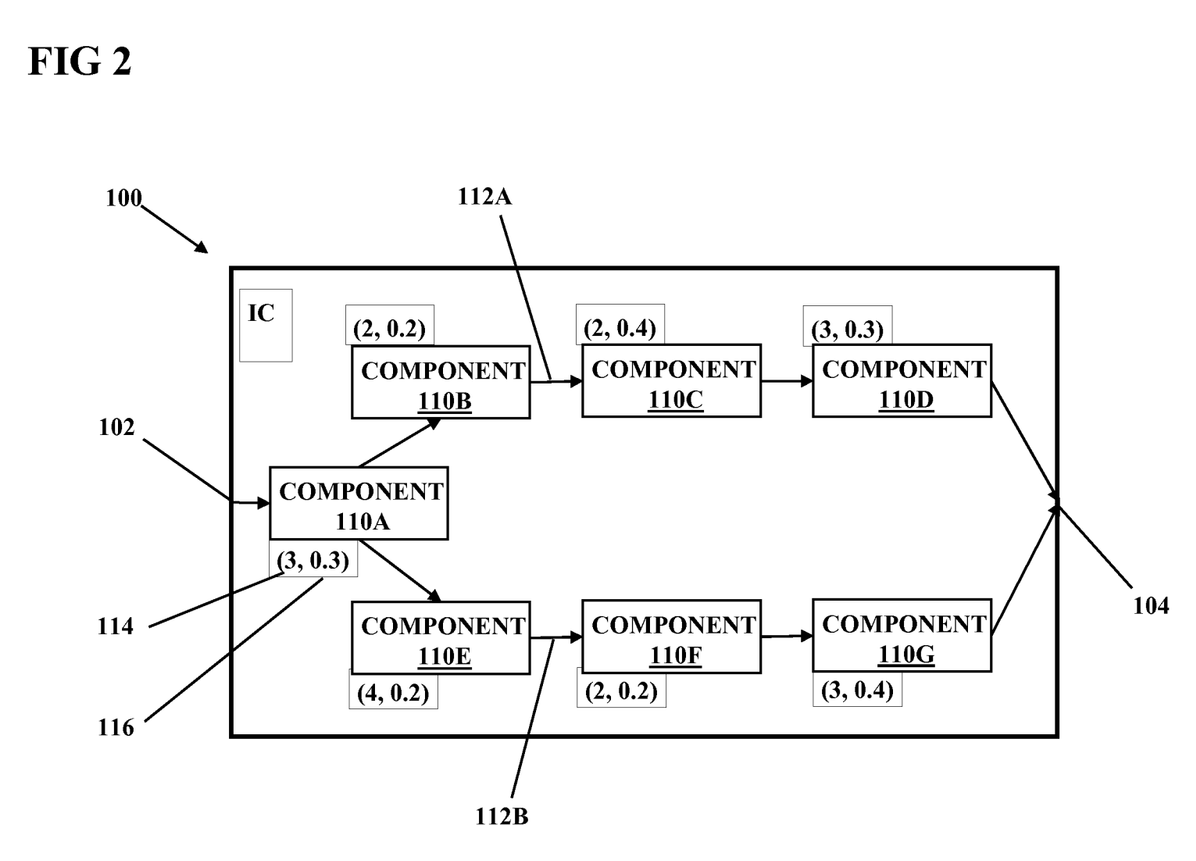
FIG. 2 shows an example integrated circuit (IC) according to an embodiment of the present invention.

Referring now to FIG. 2, an example integrated circuit (IC) 100 is shown. As shown, IC 100 includes a number of components 110A-G that are integrated into IC 100. Components 110A-G may include circuits, logic gates, or any other type of component that can be integrated in an integrated circuit. It should also be clear that the number of components 110A-G shown herein is only illustrative and should not be taken as limiting. An electrical signal enters IC 100 through inputs 102 and leaves IC 100 from outputs 104. Also shown within IC 100 are a number of paths 112A-B that connect various ones of components 110A-G within IC 100. As shown, path 112A connects components 110A-D, while path 112B connects components 110A and 110E-G. As with the number of components 110A-G, the number and arrangement of paths 112A-B are merely illustrative and should not be taken as limiting. Associated with each component 110A-G is a set of values 114, 116, that represent a delay 114 and a variation 116. Delay 114 represents the time that it is expected to take for a signal to travel through a particular component 110A-G. Variation 116 is a value that represents a range of expected variation in value of delay 114. It should also be recognized that delay 114 and variation 116 values may also be applicable to portions of paths 112A-B, internal portions within components 110A-G or elsewhere within component. In general, multiple sources of variation may be represented and propagated during SSTA, resulting in a plurality of distributions in the timing slack representation.

Referring now to FIGS. 1 and 2 in combination, computer system 12 (e.g., SSTA computation module 32) computes a statistical static timing analysis (SSTA) for IC 100. An SSTA can be used to model process variations. These process variations can manifest themselves in, for example, a die to die comparison of the masks that are used to make a particular family of ICs using lithography, doping, etc. In doing so, SSTA computation module 32 can compute SSTA for IC 100 using any solution now known or later conceived in the art.

To this extent, multiple parameters which may be externally correlated can be propagated by SSTA computation module 32. During propagation, an internal representation of these parameters are assumed to be 100% independent from each other, such that a change in one parameter has no effect on any others. However, each parameter instance can be 100% correlated to other instances of the same parameter. In this case, joint probabilities could be considered, and one aspect of this could be that it would be less likely for both parameters to be at their worst case simultaneously. To account for this independence, the parameters can be RSSed with each other during projection. During this RSS projection operation, one subset of the distributions being RSSed may be modeled as Truncated to allow for pessimism reduction, while another subset may be modeled as traditional Gaussians. During propagation both sets can be treated as traditional Gaussians, which maintains computational efficiency.

Figure 3:
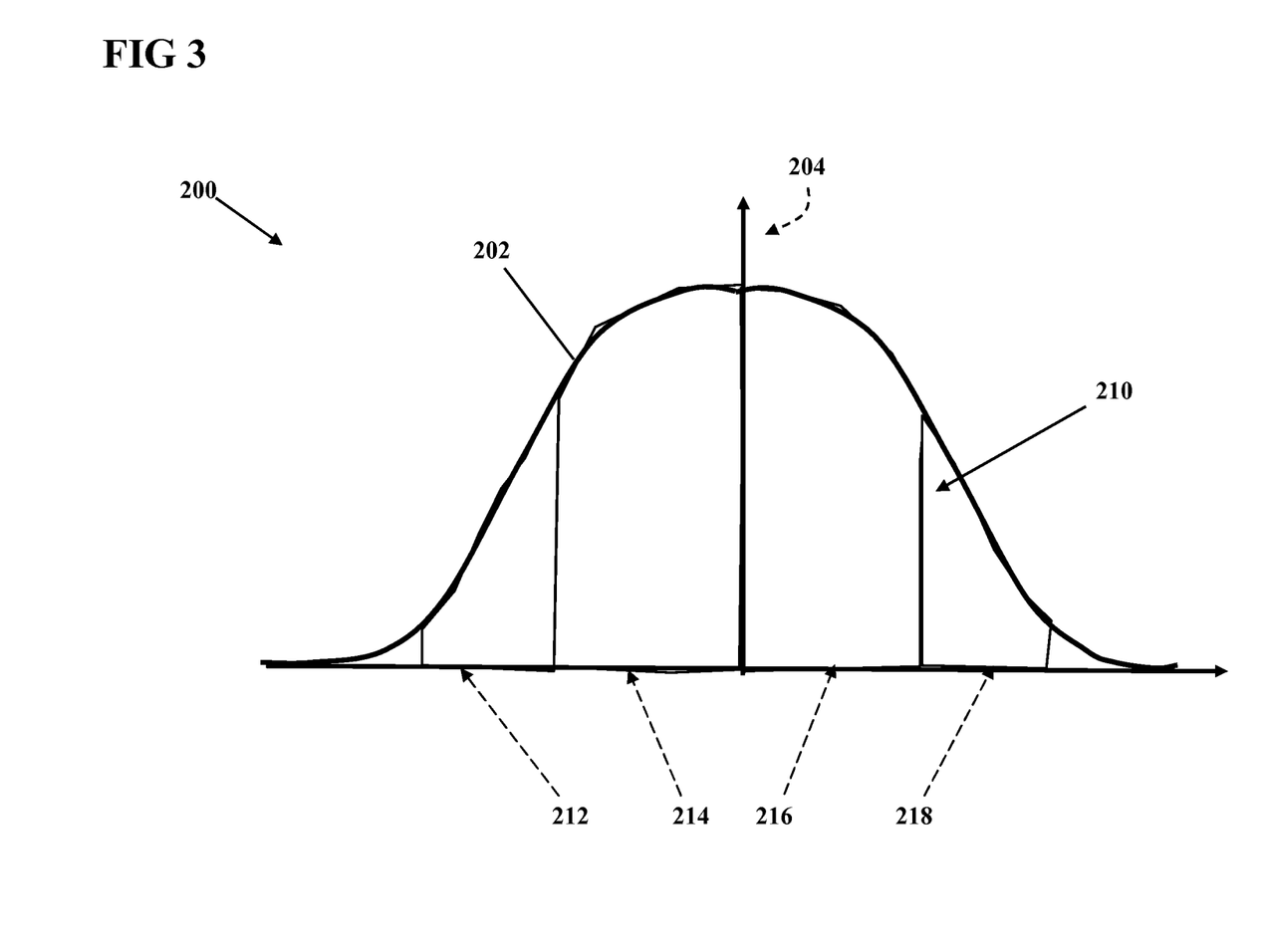
FIG. 3 shows a Gaussian figure representing an example Gaussian distribution according to an embodiment.

Turning now to FIG. 3, a Gaussian figure 200 representing an example Gaussian distribution is shown. Gaussian figure 200 can be used to show the timing of an integrated circuit based on the SSTA. Gaussian figure 200 has a bell curve shaped graph 202 and a mean 204. In addition, the data 210 under graph has been divided into regions 212-218 based on standard deviations with regions 214 and 216 being one standard deviation from mean 204 and regions 212 and 218 being two standard deviations from mean 204. Gaussian figure 200 can be used to show the timing of an integrated circuit that includes the sources of variance, requiring one Gaussian per independent source of variation.

Figure 4:
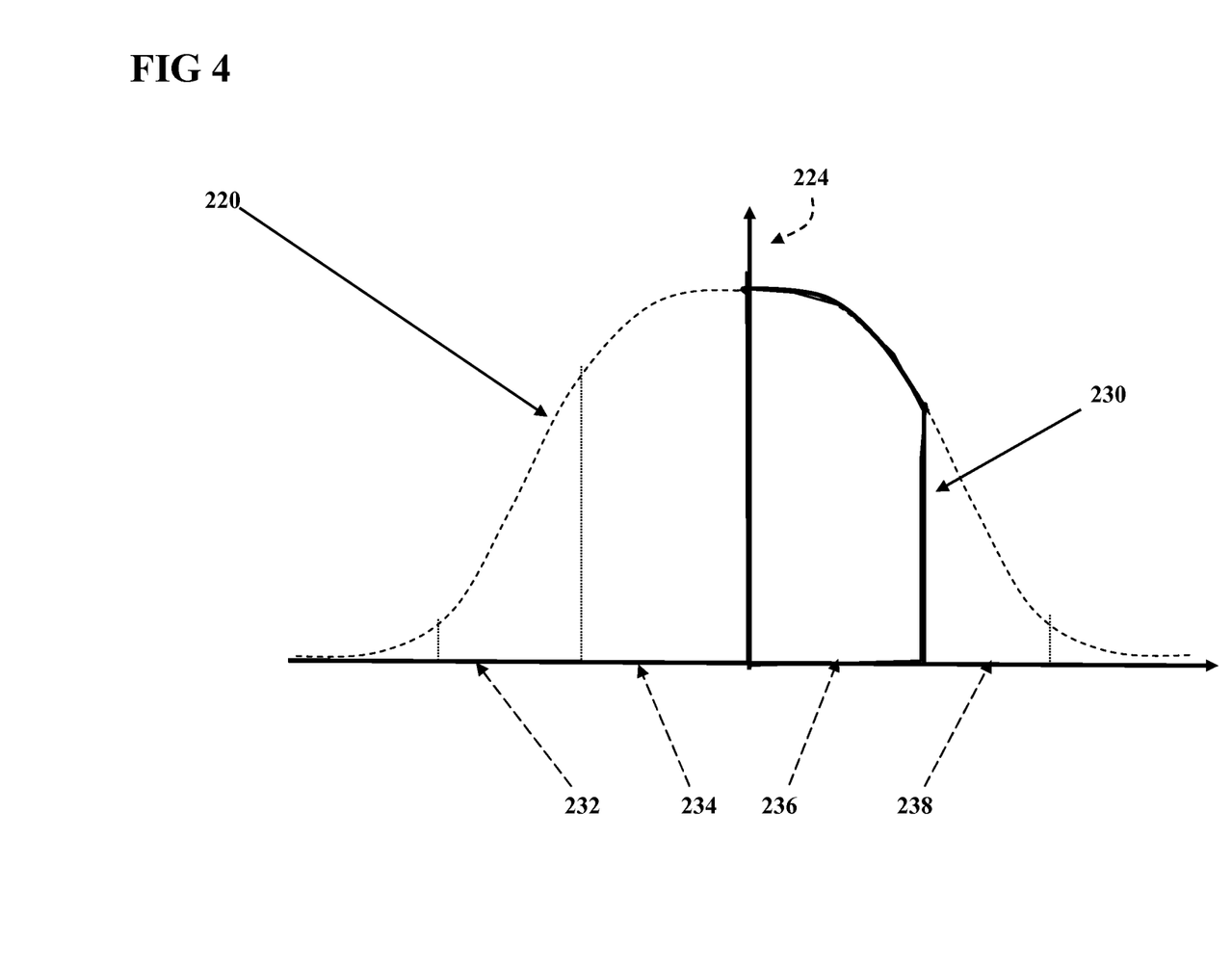
FIG. 4 shows a truncated Gaussian figure according to an embodiment.

Referring back to FIG. 1, computer system 12 (e.g., subset identification module 34) identifies a subset of Gaussian distributions that are to be projected as truncated, and a remaining subset of Gaussian distributions. Identification module 34 can identify these two subsets using a variety of solutions. FIG. 4 shows an altered Gaussian figure 220, which has been truncated to include only a single region of one standard deviation. As can be seen, the region to the left of 232, region 232, region 234, region 238, and the region to the right of 238 have been eliminated from the distribution, truncating it in region 236 between 0 and +1 sigma. Identification of this type can be arbitrary and can be determined to satisfy a number of possible constraints. An example of such a constraint is voltage binning. In selective voltage binning, ICs having processes that are slower than normal (e.g., outside a predetermined deviation, to the left of region 236 in FIG. 4), could have an increased voltage applied in order to increase process speed. So, for example, voltage would be increased in ICs whose slack is otherwise below the bound on region 236 to increase speed so as to move the ICs into region 236. Similarly, ICs having processes that are faster than normal (e.g., outside a predetermined deviation), could have a decrease voltage applied in order to decrease process speed, moving ICs that would otherwise fall to the right of region 236 into region 236. As a result, all regions except 236 have been truncated from the Gaussian.

Figure 5:
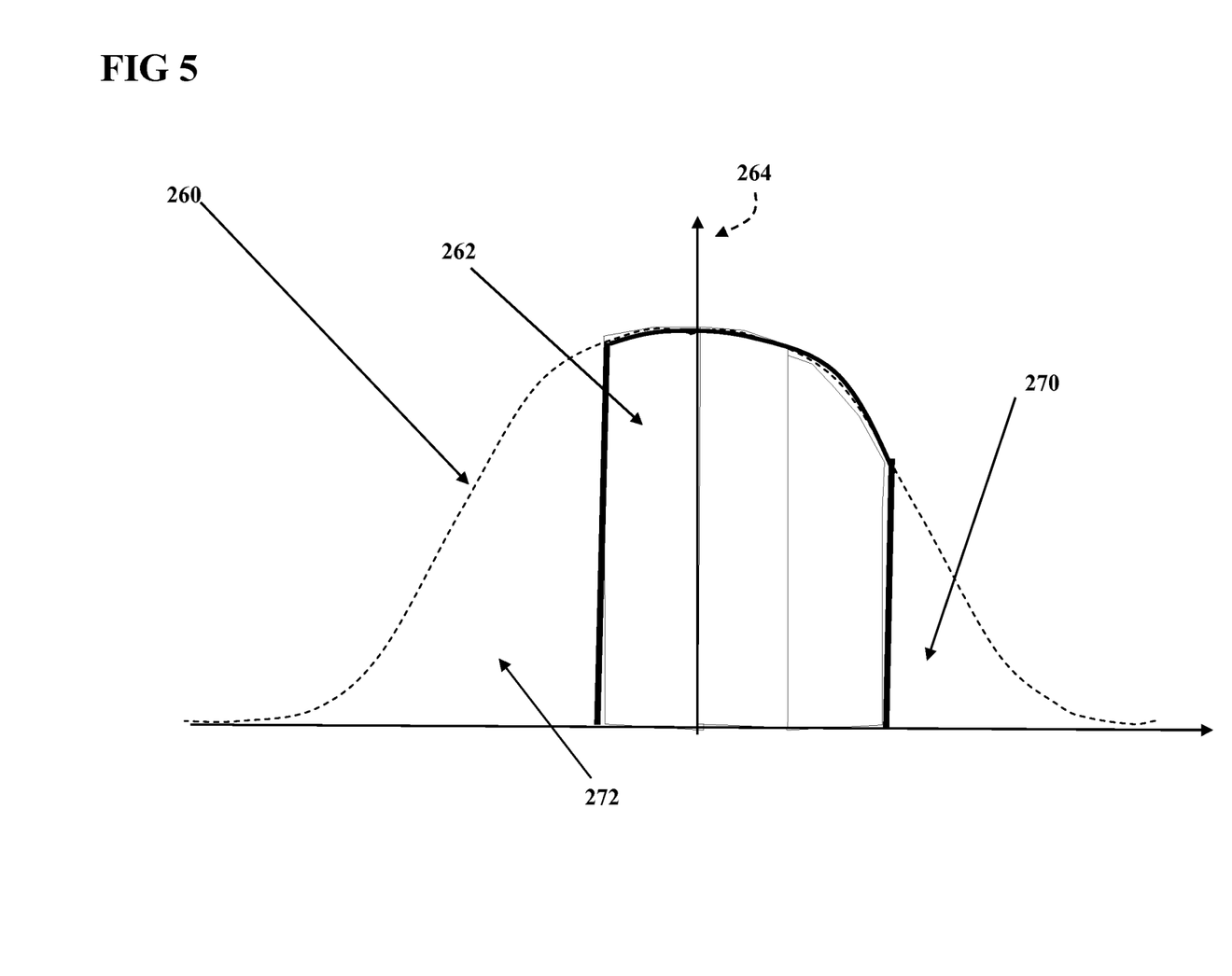
FIG. 5 shows a truncated Gaussian figure according to an embodiment.

Alternatively, FIG. 5 shows another altered Gaussian figure 260 in which regions 272 and 270 have been eliminated from consideration, identified according to an embodiment. This leaves the remaining truncated Gaussian in region 262. As can be seen, in contrast to FIG. 4, identified truncated regions 272 and 270 in Gaussian figure 260 are not necessarily based on deviations. Rather, ICs having processes that are not within an acceptable range have been removed. For example, ICs can be tested as they come off the production line, and those ICs having processes that do not fall within the acceptable speed range can be removed from the batch. Testing can be performed using any tools now known or later developed for obtaining physical test results, including, but not limited to a product screening ring oscillator.

In any case, removal of truncated region to the left of 232, region 232, region 234, and region 238, and the region to the right of 238 (FIG. 4), 270, 272 (FIG. 5) from Gaussian figure 220 (FIG. 4), 260 (FIG. 5) by subset identification module 34 yields remainder region 236 (FIG. 4), 262 (FIG. 5) that is not Gaussian. As such, propagation calculations based on the non-Gaussian remainder portion using the usual straight forward brute force method would be resource and time intensive. Alternatively, calculations that attempt to utilize the entire Gaussian figure would be inaccurate by being unnecessarily pessimistic as a result of the inclusion of data that is outside of that which is actually being included. Therefore it is beneficial to have a method that allows propagation of the full Gaussian representation during SSTA, while considering the truncation during RSS projection to a specific deterministic value. This process becomes complicated as typically many independent sources of variation are propagated, only some of which may require truncation. One important problem that must be overcome is how to RSS project multiple independent parameters, each of which modeled by an independent Gaussian distribution, with some subset of those distributions being truncated.

Referring back to FIG. 1, computer system 12 (e.g., data factor obtaining module 36) obtains data factors that can used to enable RSSing a set of Gaussian distributions, of which some subset is truncated. These data factors include a representation of a ratio between the remainder subset and the truncated subset The entire set of Gaussian distributions can be represented by the following equation:

$$t_0 + (a_{GT}\Delta X_{GT} + a_1\Delta X_1 + a_2\Delta X_2 + \ldots + a_n\Delta X_n)$$

where $t_0$ is the mean variable, $a_i$ is a sensitivity to the $i^{th}$ source of variation, and $\Delta X_i$ is the Gaussian representing that source of variation. As shown, $a_{GT}\Delta X_{GT}$ represents the truncated subset while $a_1\Delta X_1+a_2\Delta X_2+ \ldots +a_n\Delta X$ represents the remainder subset. This equation can be simplified by combining via RSSing the parameters of the remainder subset to get:

$$t_0+(a_{GT}\Delta X_{GT}+a\Delta Y)$$

where a is the root sum square of $a_1, a_2, \ldots a_n$ and $\Delta Y$ is a Gaussian Distribution for the remainder subset. The truncated parameter can then be isolated according to the following:

$$t_0 + a_{GT}\left(\Delta X_{GT} + \frac{a}{a_{GT}}\Delta Y\right).$$

Figure 6:
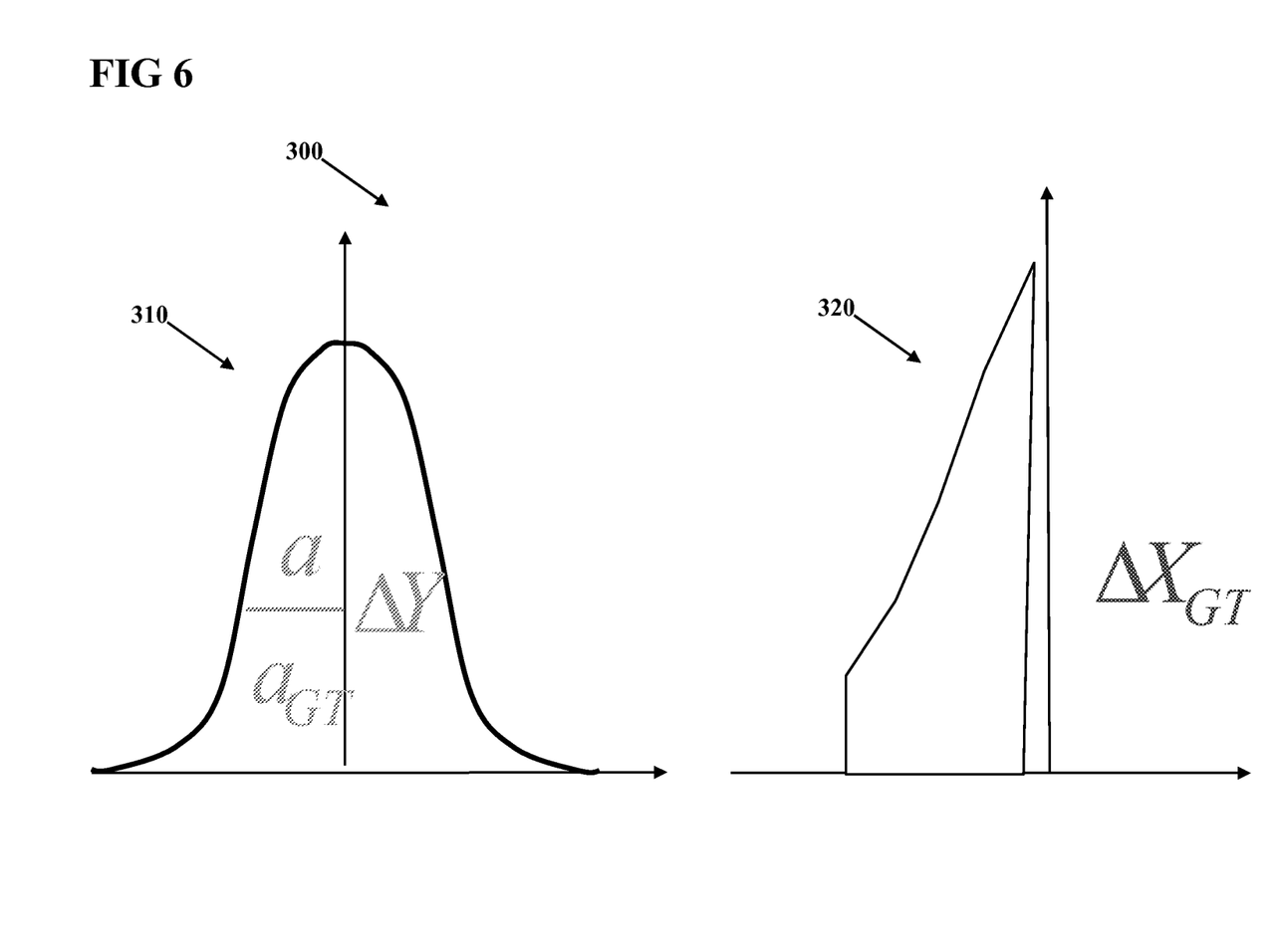
FIG. 6 shows a graphical representation that includes a parameter modeled as using the shown truncation on the right, and the remaining non-truncated parameter(s) on the left

Turning now to FIG. 6, a graphical representation 300 of the above equation is shown. As shown, figure 320 represents the truncated parameter represented by $\Delta X_{GT}$. Similarly, figure 310 represents the outcome of the remainder portion $$\frac{a}{a_{GT}}\Delta Y$$

above.

$$\frac{a}{a_{GT}}$$

represents the ratio of the remainder portion to the truncated portion used in the data factors.

A relationship between the data factor $$\frac{a}{a_{GT}}$$

(represented hereafter by $\lambda$) and the mean projection can be evaluated using the following equation:

$$F(t) = \frac{\frac{1}{2\pi}\int_L^U \int_{-\infty}^{-\lambda x+t} e^{-\frac{1}{2}(x^2+y^2)} dx dy}{\Phi(U)-\Phi(L)} = \frac{\int_L^U \phi(x)\Phi(-\lambda x+t) dx}{\Phi(U)-\Phi(L)}$$

where F(t) is probability distribution function of the timing quantity to be projected, U and L are the upper and lower limits of the truncation, $\Phi$ is the Gaussian cumulative distribution function, and $\phi$ is the Gaussian probability density function. The result of this computation is a series of relationships between t and $\lambda$. Assuming a required projection level $n\sigma$ (usually $3\sigma$) projected values $t_{pr}$ for different ratios of $\lambda$ can be computed by solving the following equation $F(t_{pr})=\Phi(n\sigma)$. These data factor values can be created dynamically as needed or, in the alternative data factors 42 (FIG. 1) can be pre-calculated for some set of truncation conditions and stored in a table that preserves the relationships between differing values of t and $\lambda$.

Figure 7:
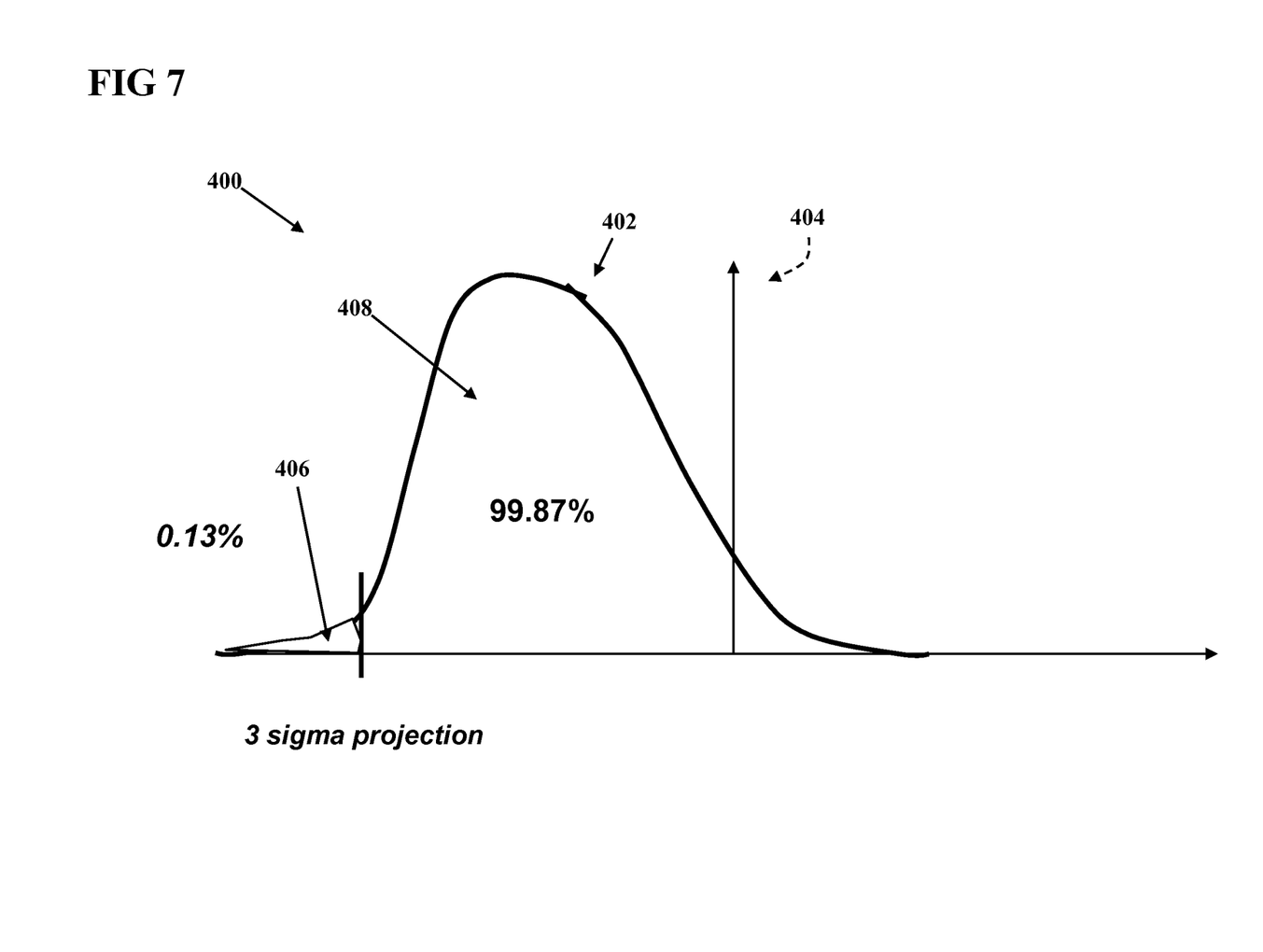
FIG. 7 shows a result of a convolution operation and the corresponding 3 sigma projection according to an embodiment.

Turning to FIG. 7 in conjunction with FIG. 6, a convolution and projection 400 of FIGS. 310 and 320 are shown. The result of convolution and projection 400 is a convolution graph 402 having a small section 406 representing the truncated portion and a majority section 408 representing the remainder portion. Small section 406 is also represented by L in the above equation while large section 408 is represented by U. Convolution and projection 400 also has a projected value 404. As illustrated in the figure, projected value 404 is a 3 sigma projection although it should be understood that other scenarios are envisioned.

Turning back to FIG. 1, computer system 12 (e.g., data factor application module 38) applies the data factors 42 computed by data factor obtaining module 36 to the SSTA. These data factors 42 can then be used to project the slack for the integrated circuit with some subset of Gaussian modeled variation sources being having truncated distributions.

Figure 8:
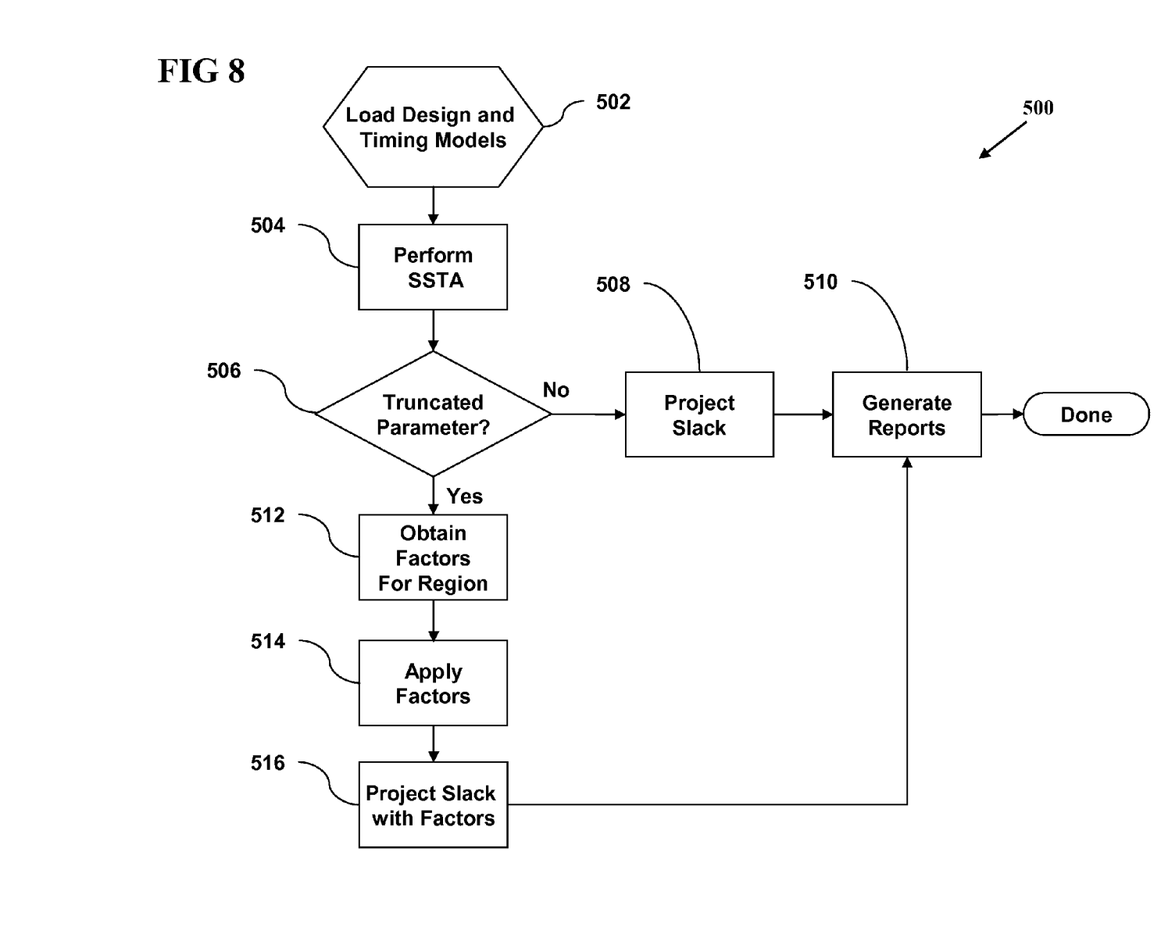
FIG. 8 shows a method flow diagram illustrating steps in a method of projecting slack in an IC in accordance with an embodiment.

Turning now to FIG. 8 in conjunction with FIG. 1, a method flow diagram 500 illustrating steps in a method of projecting slack in an IC in accordance with an embodiment is shown. In step 502 design and timing models are loaded. In step 504 SSTA computation module 32 performs an SSTA on the design and time models. In step 506, subset identification module 34 determines whether a parameter will be truncated. In not, slack is projected in step 508 and reports are generated in step 510. In the alternative, data factor obtaining module 36 obtains factors that have been computed for the region in step 512. Then, data factor application module 38 applies the data factors in step 514 and projects slack using the data factors in step 516. Finally, in step 510, reports are generated.

While shown and described herein as a method and system for projecting slack in an integrated circuit, it is understood that aspects of the invention further provide various alternative embodiments. For example, in one embodiment, the invention provides a computer program fixed in at least one computer-readable medium, which when executed, enables a computer system to verify the integrity of a transaction. To this extent, the computer-readable medium includes program code, such as transaction integrity verification program 30 (FIG. 1), which implements some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, such as transaction integrity verification program 30 (FIG. 1), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for projecting slack in an integrated circuit. In this case, a computer system, such as computer system 12 (FIG. 1), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "approximately" used in connection with a quantity is inclusive of the stated value and has the meaning dictated by the context, (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to approximately 25 wt %, or, more specifically, approximately 5 wt % to approximately 20 wt %", is inclusive of the endpoints and all intermediate values of the ranges of "approximately 5 wt % to approximately 25 wt %," etc).

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of projecting slack in an integrated circuit, the method comprising:
   computing, using a computer device, a statistical static timing analysis (SSTA) over a plurality of variation sources to get a plurality of Gaussian distributions having a Gaussian distribution for each variation source;
   identifying, from the plurality of Gaussian distributions, a truncated subset and a remainder subset, the truncated subset including a portion of the plurality of Gaussian distributions that is not to be considered in projecting the slack;
   obtaining data factors representing a ratio between the remainder subset and the truncated subset; and
   applying the data factors to the SSTA to root sum square (RSS) project the slack for the integrated circuit that takes into account an absence of the truncated subset.

2. The method of claim 1, wherein the truncated subset and the remainder subset are defined to satisfy constraints defined by a timing analysis for a purpose of selective voltage binning.

3. The method of claim 1, wherein the truncated subset and the remainder subset are defined to satisfy constraints defined by timing analysis for a purpose of screening for chip performance.

4. The method of claim 1, wherein the data factors are obtained by computing a convolution using $$t_0 + a_{GT}\left(\Delta X_{GT} + \frac{a}{a_{GT}}\Delta Y\right)$$

where $t_0$ is a mean variable, a is a root sum square of sensitivities, $a_{GT}$ is sensitivity of the truncated subset, $\Delta Y$ is a Gaussian distribution for the remainder subset and $\Delta X_{GT}$ is a truncated Gaussian for the truncated subset.

5. The method of claim 4, wherein the data factors are further obtained by computing a projection using $$F(t) = \frac{\frac{1}{2\pi}\int_L^U \int_{-\infty}^{-\lambda x+t} e^{-\frac{1}{2}(x^2+y^2)}dxdy}{\Phi(U)-\Phi(L)} = \frac{\int_L^U \phi(x)\Phi(-\lambda x+t)dx}{\Phi(U)-\Phi(L)}$$

where U and L are upper and lower limits of the truncated portion, $\Phi$ is a Gaussian cumulative distribution function, and $\phi$ is a Gaussian probability density function.

6. The method of claim 5, wherein the data factors are dynamically generated as needed for application.

7. The method of claim 5, wherein the data factors are pre-computed and stored in a table preserves relationships of the data factors.

8. A computer system comprising:
   a set of computing devices configured to projecting slack in an integrated circuit, by performing actions comprising:
   computing a statistical static timing analysis (SSTA) to get a Gaussian representation over a plurality of variation sources;
   identifying a truncated subset and a remainder subset of the Gaussian representation, the truncated subset including a portion of the plurality of Gaussian distributions that is not to be considered in projecting the slack;
   obtaining data factors representing a ratio between the remainder subset and the truncated subset; and
   applying the data factors to the SSTA to root sum square (RSS) project the slack for the integrated circuit that takes into account an absence of the truncated subset.

9. The method of claim 8, wherein the truncated subset and the remainder subset are defined to satisfy constraints defined by a timing analysis for a purpose of selective voltage binning.

10. The computer system of claim 8, wherein the data factors are obtained by computing a convolution using $$t_0 + a_{GT}\left(\Delta X_{GT} + \frac{a}{a_{GT}}\Delta Y\right)$$

where $t_0$ is a mean variable, a is a root sum square of sensitivities, $a_{GT}$ is sensitivity of the truncated subset, $\Delta Y$ is a Gaussian distribution for the remainder subset and $\Delta X_{GT}$ is a truncated Gaussian for the truncated subset.

11. The computer system of claim 10, wherein the data factors are further obtained by computing a projection using $$F(t) = \frac{\frac{1}{2\pi}\int_L^U \int_{-\infty}^{-\lambda x+t} e^{-\frac{1}{2}(x^2+y^2)}dxdy}{\Phi(U)-\Phi(L)} = \frac{\int_L^U \phi(x)\Phi(-\lambda x+t)dx}{\Phi(U)-\Phi(L)}$$

where U and L are upper and lower limits of the truncated portion, $\Phi$ is a Gaussian cumulative distribution function, and $\phi$ is a Gaussian probability density function.

12. The computer system of claim 11, wherein the truncated subset and the remainder subset are identified based on physical test results.

13. The computer system of claim 11, wherein the data factors are dynamically generated as needed for application.

14. A program product stored on a computer readable storage device for projecting slack in an integrated circuit, which when executed on at least one computing device, performs the following:
- computes a statistical static timing analysis (SSTA) to obtain Gaussian distributions over a plurality of variation sources;
- identifies a truncated subset and a remainder subset of the Gaussian distributions, the truncated subset including a portion of the plurality of Gaussian distributions that is not to be considered in projecting the slack;
- obtains data factors representing a ratio between the remainder subset and the truncated subset; and
- applies the data factors to the SSTA to root sum square (RSS) project the slack for the integrated circuit that takes into account an absence of the truncated subset.

15. The method of claim 14, wherein the truncated subset and the remainder subset are defined to satisfy constraints defined by timing analysis for the purpose of selective voltage binning.

16. The method of claim 14, wherein the truncated subset and the remainder subset are defined to satisfy the constraints as defined by timing analysis for the purpose of screening for chip performance.

17. The program product of claim 14, wherein the data factors are obtained by computing a convolution using $$t_0 + a_{GT}\left(\Delta X_{GT} + \frac{a}{a_{GT}}\Delta Y\right)$$

where $t_0$ is a mean variable, a is a root sum square of sensitivities, $a_{GT}$ is a sensitivity of the truncated subset, $\Delta Y$ is a Gaussian distribution for the remainder portion and $\Delta X_{GT}$ is a truncated Gaussian for the truncated portion.

18. The program product of claim 17, wherein the data factors are further obtained by computing a projection using $$F(t) = \frac{\frac{1}{2\pi}\int_L^U \int_{-\infty}^{-\lambda x + t} e^{-\frac{1}{2}(x^2+y^2)}dxdy}{\Phi(U) - \Phi(L)} = \frac{\int_L^U \phi(x)\Phi(-\lambda x + t)dx}{\Phi(U) - \Phi(L)}$$

where U and L are upper and lower limits of the truncated portion, $\Phi$ is a Gaussian cumulative distribution function, and $\phi$ is a Gaussian probability density function.

19. The program product of claim 18, wherein the data factors are dynamically generated as needed for application.

20. The program product of claim 18, wherein the data factors are pre-computed and stored in a table preserves relationships of the data factors.

* * * * *